US007628668B2

(12) United States Patent  (10) Patent No.: US 7,628,668 B2
Mitsuya  (45) Date of Patent: Dec. 8, 2009

(54) METHOD FOR MANUFACTURING ORGANIC EL DEVICE AND ELECTRONIC APPARATUS

(75) Inventor: Masayuki Mitsuya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 234 days.

(21) Appl. No.: 11/760,838

(22) Filed: Jun. 11, 2007

(65) Prior Publication Data

US 2008/0085422 A1  Apr. 10, 2008

(30) Foreign Application Priority Data

Jul. 6, 2006  (JP) ............................ 2006-186813

(51) Int. Cl.
 H01J 9/00 (2006.01)
(52) U.S. Cl. ........................................ 445/24; 313/506
(58) Field of Classification Search ......... 313/495–512; 428/690–691, 917; 438/26–29, 34, 82; 445/23, 445/24, 46, 51, 52, 66, 67, 72
 See application file for complete search history.

(56) References Cited

U.S. PATENT DOCUMENTS

| 5,247,226 | A * | 9/1993 | Sato et al. .................... 313/504 |
| 6,586,764 | B2 | 7/2003 | Buechel et al. |
| 7,189,771 | B2 | 3/2007 | Hsu |
| 7,317,047 | B2 | 1/2008 | Hsu |
| 2004/0018386 | A1* | 1/2004 | Naito et al. ................. 428/690 |
| 2004/0124504 | A1 | 7/2004 | Hsu |
| 2004/0132228 | A1* | 7/2004 | Magno et al. ................. 438/99 |
| 2005/0170211 | A1 | 8/2005 | Fujioka |
| 2005/0186106 | A1 | 8/2005 | Li et al. |
| 2006/0051611 | A1* | 3/2006 | Brunner et al. ............. 428/690 |
| 2006/0108919 | A1 | 5/2006 | Kobayashi |
| 2006/0232196 | A1* | 10/2006 | Hachiya et al. ............. 313/504 |
| 2007/0090753 | A1* | 4/2007 | Arakane ..................... 313/504 |
| 2007/0194701 | A1* | 8/2007 | Ito et al. ..................... 313/506 |
| 2008/0246391 | A1* | 10/2008 | Iwakuma et al. ............ 313/504 |

FOREIGN PATENT DOCUMENTS

| JP | A-2001-203081 | 7/2001 |
| JP | A-2002-175887 | 6/2002 |
| JP | A-2004-063139 | 2/2004 |
| JP | A-2004-519830 | 7/2004 |
| JP | A-2005-216823 | 8/2005 |
| JP | A-2005-243300 | 9/2005 |
| JP | A-2005-302443 | 10/2005 |
| JP | A-2006-502254 | 1/2006 |
| JP | A-2006-173089 | 6/2006 |
| JP | A-2006-236596 | 9/2006 |
| JP | A-2006-237038 | 9/2006 |
| WO | WO 2005/015654 A1 | 2/2005 |
| WO | WO 2005-100464 A1 | 10/2005 |

* cited by examiner

Primary Examiner—Joseph L Williams
Assistant Examiner—Brenitra M Lee
(74) Attorney, Agent, or Firm—Oliff & Berridge, PLC

(57) ABSTRACT

A method for manufacturing an organic EL device including an organic EL element provided on a substrate and having a plurality of organic layers including at least a hole injection layer and a luminescent layer, and a cathode and an anode holding the organic layers therebetween includes forming the anode on the substrate, forming the hole injection layer on the anode using a hole injection layer forming material containing an organic material and a metal element, forming the luminescent layer on the hole injection layer, and forming the cathode on the luminescent layer.

11 Claims, 8 Drawing Sheets

METHOD FOR MANUFACTURING ORGANIC EL DEVICE AND ELECTRONIC APPARATUS

BACKGROUND

1. Technical Field

The present invention relates to a method for manufacturing an organic EL device and an electronic apparatus.

2. Related Art

There have been developed organic EL devices each including an array of organic EL elements. Each of the organic EL elements includes an organic luminescent layer disposed between an anode and a cathode so that holes supplied from the anode and electrons supplied from the cathode recombine in the luminescent layer to emit light. In order to improve the efficiency of hole injection from the anode to the luminescent layer, a hole injection layer is formed on the surface of the anode (refer to, for example, Japanese Unexamined Patent Application Publication Nos. 2001-203081, 2002-175887, and 2005-302443).

Organic EL devices are generally said to have a short emission lifetime, and there is thus demand for increasing the emission lifetime.

SUMMARY

An advantage of some aspects of the invention is that the invention provides a method for manufacturing an organic EL device capable of improving an emission lifetime, and an electronic apparatus.

In accordance with an embodiment of the invention, a method for manufacturing an organic EL device includes forming an anode on a substrate, forming a hole injection layer on the anode using a hole injection layer forming material containing an organic material and a metal element, forming a luminescent layer on the hole injection layer, and forming a cathode on the luminescent layer, the organic EL device including an organic EL element provided on the substrate and having a plurality of organic layers including at least the hole injection layer and the luminescent layer, and the cathode and the anode holding the organic layers therebetween.

The inventors have found that when a hole injection layer is formed on an anode composed of ITO (Indium Tin Oxide), indium element contained in the anode diffuses into the hole injection layer. It has been also found that when the hole injection layer contains indium element, the drive voltage of the hole injection layer is decreased to increase the emission lifetime of an organic EL device. It has been further found that the metal element is not limited to indium element, and the same effect is obtained by other metal elements.

Therefore, in the embodiment of the invention, the anode is formed on the substrate, and the hole injection layer is formed on the anode using the hole injection layer forming material containing an organic material with a hole injection ability and a metal element. Thus, the hole injection layer containing a metal element is formed. As a result, the drive voltage of the hole injection layer is decreased, and the lifetime of the organic EL device is increased.

The hole injection layer forming material preferably contains a salt of the metal element.

Since the hole injection layer forming material contains a salt of the metal element, the metal element is easily contained in the hole injection layer as compared with a case in which an unstable metal element is contained in an elemental form.

The metal element is preferably at least one of indium element, and magnesium element.

As a result, the drive voltage of the hole injection layer is decreased, and the lifetime of the organic EL device is increased. In particular, magnesium element or magnesium salt has the advantage of high safety for the human body and environments.

The organic EL element further includes an intermediate layer disposed between the hole injection layer and the luminescent layer. Therefore, the manufacturing method preferably further includes forming the intermediate layer on the hole injection layer between the formation of the hole injection layer and the formation of the luminescent layer.

It may be possible to increase the lifetime of the organic EL device by providing the intermediate layer. As a material for the intermediate layer, an organic material is preferably used.

The luminescent layer is preferably composed of a luminescent material emitting red light.

With the luminescent material emitting red light, the problem of decreasing luminescence is very small even when impurities such as a metal element are mixed in the organic EL element. Therefore, the lifetime of the organic EL device is increased without influence on light emission.

Further, a plurality of the organic EL elements is provided and arranged in a matrix. The luminescent layers constituting the plurality of the organic EL elements include a first luminescent layer emitting light at a first wavelength and a second luminescent layer emitting light at a second wavelength different from the first wavelength. It is preferred that the hole injection layer of the organic EL element including the first luminescent layer and the hole injection layer of the organic EL element including the second luminescent layer contain different types of metal elements.

The plurality of the organic EL elements is provided and arranged in a matrix, and the luminescent layers constituting the plurality of the organic EL elements include the first luminescent layer emitting light at a first wavelength and the second luminescent layer emitting light at a second wavelength different from the first wavelength. Furthermore, the hole injection layer of the organic EL element including the first luminescent layer and the hole injection layer of the organic EL element including the second luminescent layer contain different types of metal elements. Therefore, it may be possible to add an optimum metal element according to the type of the luminescent layer, thereby more effectively increasing the lifetime of the organic EL device.

Further, a plurality of the organic EL elements is provided and arranged in a matrix. The luminescent layers constituting the plurality of the organic EL elements include a first luminescent layer emitting light at a first wavelength and a second luminescent layer emitting light at a second wavelength different from the first wavelength. It is preferred that the hole injection layer of the organic EL element including the first luminescent layer and the hole injection layer of the organic EL element including the second luminescent layer contain metal elements at different concentrations.

The plurality of the organic EL elements is provided and arranged in a matrix, and the luminescent layers constituting the plurality of the organic EL elements include the first luminescent layer emitting light at a first wavelength and the second luminescent layer emitting light at a second wavelength different from the first wavelength. Furthermore, the hole injection layer of the organic EL element including the first luminescent layer and the hole injection layer of the organic EL element including the second luminescent layer contain metal elements at different concentrations. Therefore, it may be possible to add a metal element at an optimum concentration according to the type of the luminescent layer, thereby more effectively increasing the lifetime of the organic EL device.

The formation of the hole injection layer preferably includes forming a coated film of a liquid composition on the anode, the liquid composition being prepared by dissolving or dispersing the hole injection layer forming material in a solvent.

The hole injection layer is formed by a so-called liquid phase method in which the coated film of the liquid composition prepared by dissolving or dispersing the hole injection layer forming material in a solvent is formed on the anode. Therefore, the hole injection layer forming material is dissolved or dispersed in the liquid composition. As a result, the metal element in the hole injection layer forming material is chemically stabilized.

The formation of the hole injection layer preferably includes forming a coated film of a liquid composition by an ink jet method, the liquid composition being prepared by dissolving or dispersing the hole injection layer forming material in a solvent.

When an organic EL device including a plurality of organic EL elements arranged in a matrix is formed, it may be possible to the organic EL device at low cost within a short time because the hole injection layer is formed by the ink jet method.

In accordance with an embodiment of the invention, an electronic apparatus is provided with an organic EL device manufactured by the above-described method for manufacturing the organic EL device.

Since the electronic apparatus is provided with the organic EL device having a long lifetime and including the hole injection layer with a low drive voltage, the electronic apparatus has low power consumption and a long usable lifetime.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A first embodiment of the invention will be described with reference to the drawings. In each of the drawings referred to below, the dimensions of each component are appropriately changed for facilitating understanding.

Figure 1:
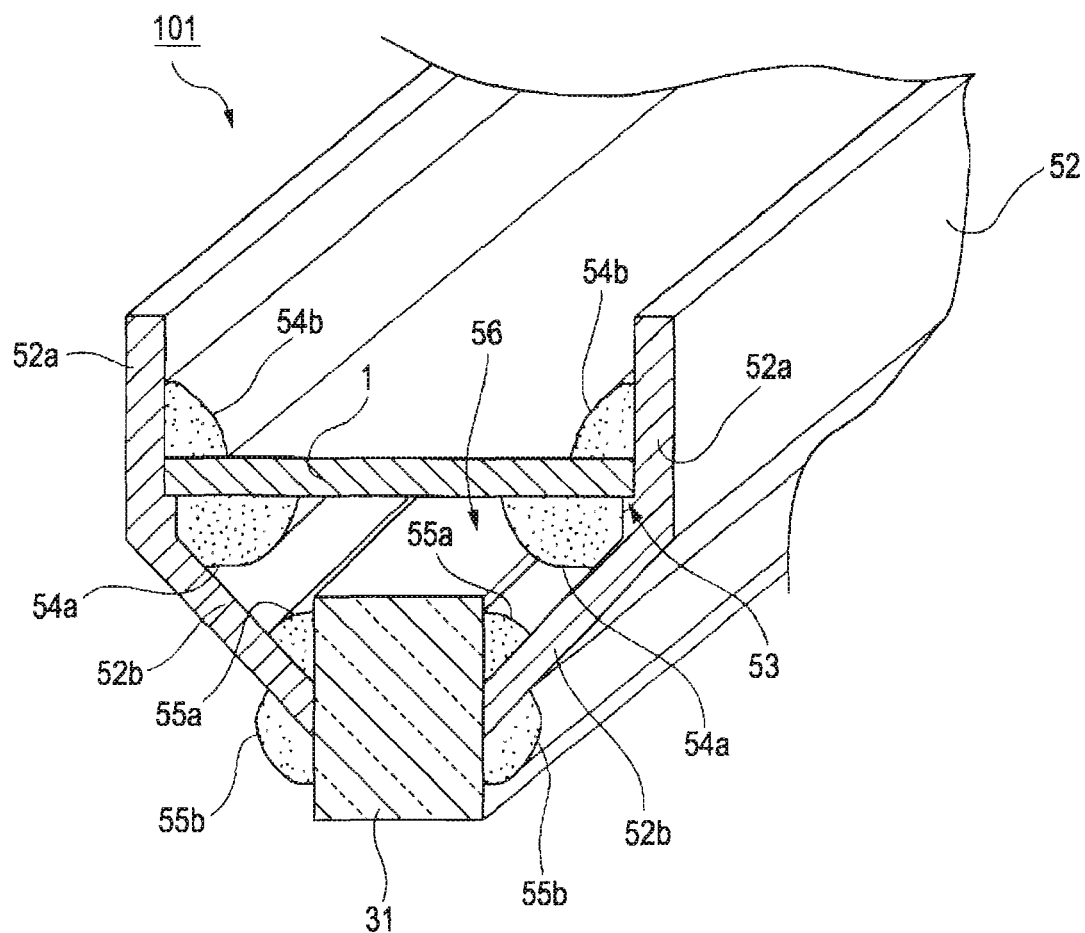
FIG. 1 is a sectional perspective view of a printer head.

FIG. 1 is a perspective sectional view of a printer head according to the first embodiment. A printer head 101 includes a light source array (organic EL device) 1 in which a plurality of organic EL elements are arrayed, a lens array 31 in which lens elements for erect 1:1 imaging of light from the light source array 1 are arrayed, and a head case 52 for supporting the peripheral portions of the light source array 1 and the lens array 31.

Figure 2:
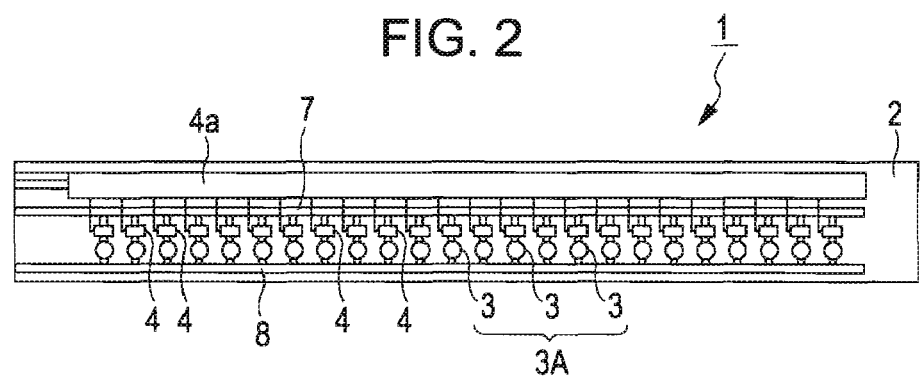
FIG. 2 is a schematic plan view of a printer head.

FIG. 2 schematically shows the light source array. The light source array 1 includes a light-emitting element row 3A in which a plurality of organic EL (EL) elements 3 is arrayed, a drive element group including drive elements 4 for driving the organic EL elements 3, and a control circuit group 4a for controlling the drive of the drive elements 4 (drive element group), these groups being integrally formed on a long thin rectangular element substrate 2. Although, in FIG. 2, the organic EL elements 3 are arrayed in one row, the organic EL elements 3 may be arrayed in two rows in a staggered form. In this case, the pitch of the organic EL elements 3 may be decreased in the longitudinal direction of the light source array 1, thereby improving resolution of a printer.

Each of the organic EL elements 3 includes at least an organic luminescent layer provided between a pair of electrodes so that light is emitted by supplying a current to the luminescent layer from the pair of electrodes. Further, a power supply line 8 is connected to one of the electrodes of each organic EL element 3, and a power supply line 7 is connected to the other electrode through the drive element 4. The drive element 4 includes a switching element such as a thin film transistor (TFT) or a thin film diode (TFD). When TFT is used for the drive element 4, the power supply line 7 is connected to the source region, and the control circuit group 4a is connected to the gate electrode. The operation of the drive element 4 is controlled by the control circuit group 4a, and conduction to the organic EL elements 3 is controlled by the drive element 4. The detailed structures and manufacturing methods of the organic EL elements 3 and the drive elements 4 will be described below.

Figure 3:
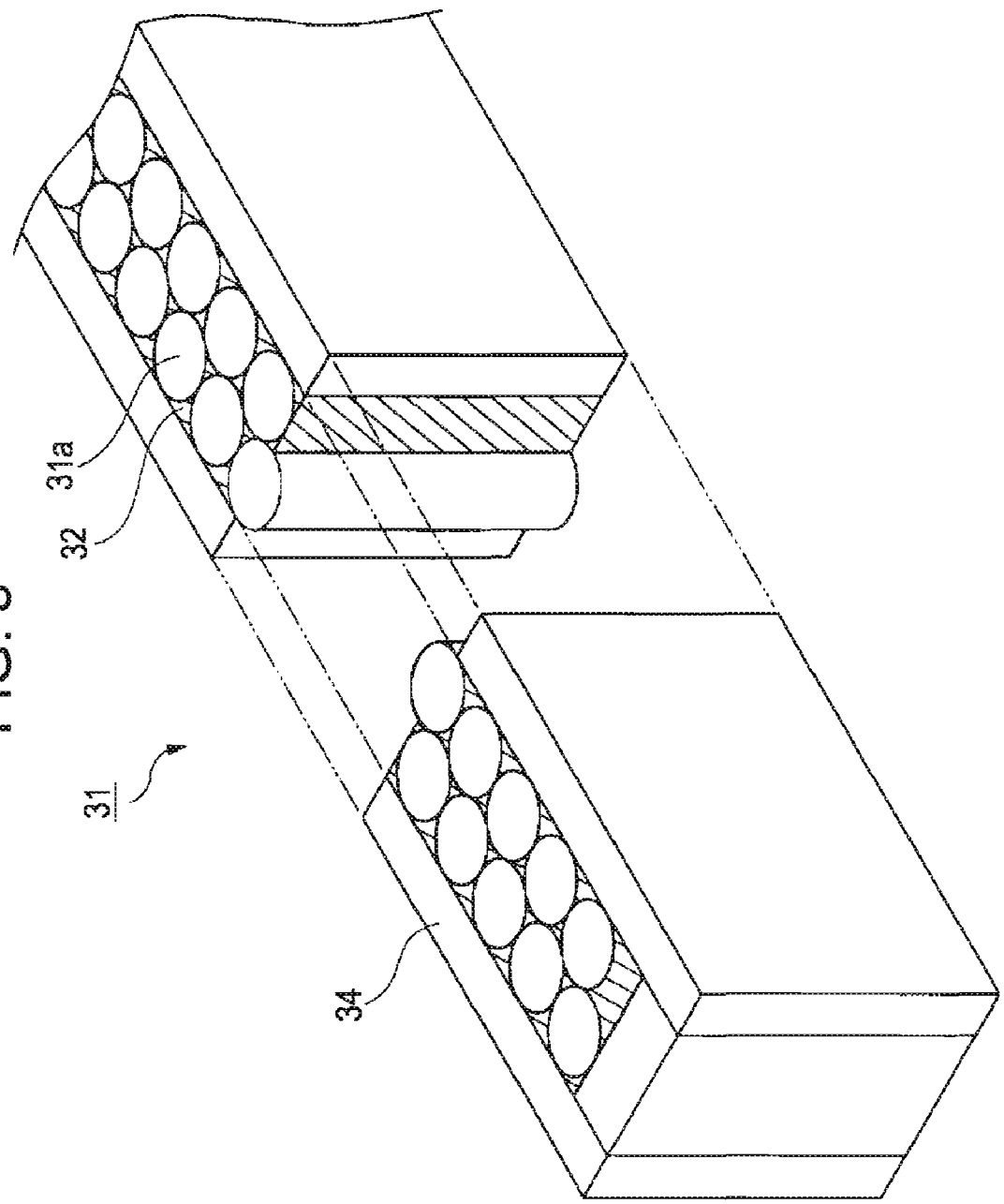
FIG. 3 is a perspective view of a lens array.

FIG. 3 is a perspective view of a lens array. The lens array 31 includes an array of lens elements 31a of Selfoc (trade name) manufactured by Nippon Sheet Glass Co., Ltd. Each of the lens elements 31a is formed into a fiber having a diameter of about 0.28 mm. The lens elements 31a are arranged in a staggered form, and the spaces between the respective lens elements 31a are filled with a black silicone resin 32. Further, a frame 34 is disposed around the lens elements 31a to form the lens array 31.

Each of the lens elements 31a has a parabolic refractive index distribution from the center to the periphery thereof. Therefore, light incident on each lens element 31a travels therein while meandering with a predetermined period. The length of each lens element 31a is controlled so as to perform erect 1:1 imaging. Erect 1:1 imaging lenses permits superposition of images formed by the adjacent lenses, thereby obtaining a wide range of image. Therefore, the lens array shown in FIG. 3 enables precise imaging of light emitted from the entire light source array.

Returning to FIG. 1, the printer head 101 according to this embodiment is provided with a head case 52 for supporting the peripheries of the light source array 1 and the lens array 31. The head case 52 is formed in a slit-like shape using a rigid material such as Al. A cross-section of the head case 52 taken along a direction perpendicular to the longitudinal direction has openings at both the upper and lower ends. The side walls 52a of the upper half are disposed in substantially parallel, and the side walls 52b of the lower half are inclined toward the central portion of the bottom end.

The light source array 1 is disposed to close the opening at the upper end of the head case 52. The light source array 1 is a bottom emission type in which an element substrate, which will be described below, is disposed to face downward. In addition, sealing materials 54a and 54b are provided over the entire peripheries of the corners formed by the side walls 52a of the head case 52 and the light source array 1.

On the other hand, the lens array 31 is disposed to close the slit-shaped lower opening of the head case 52. In addition, sealing materials 55a and 55b are provided over the entire peripheries of the corners formed by the side walls 52b of the head case 52 and the lens array 31.

Next, an organic EL device constituting the light source array 1 will be described.

Figure 4:
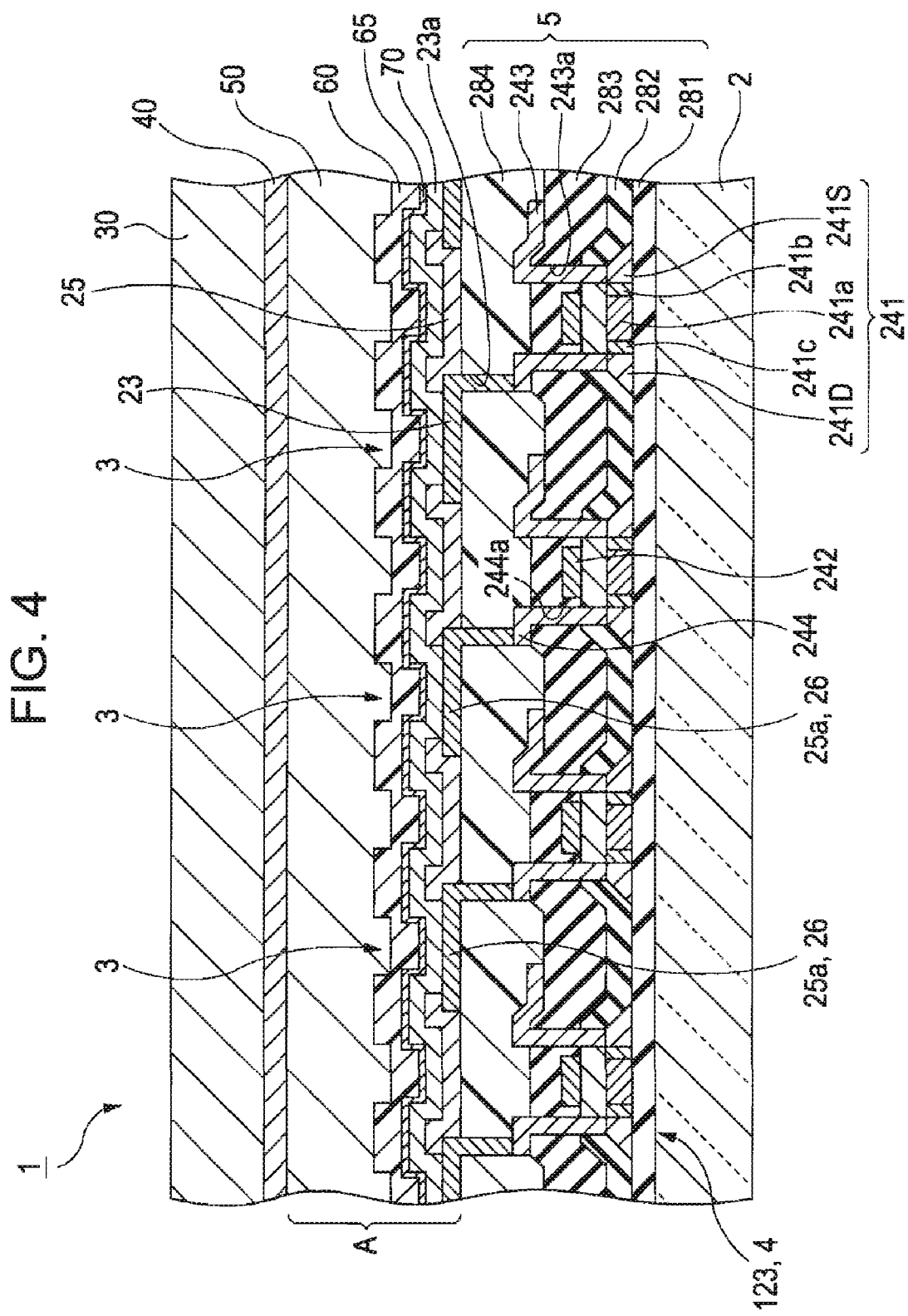
FIG. 4 is a sectional side view of an organic EL device according to a first embodiment of the invention.

FIG. 4 is a sectional side view of an organic EL device according to the first embodiment. In the organic EL device 1 according to the first embodiment, a hole injection layer 70 contains a metal element.

The organic EL device 1 mainly includes an element substrate 2, a drive circuit portion 5 disposed on the surface of the element substrate 2, a plurality of organic EL elements 3 disposed on the surface of the drive circuit portion 5, and a sealing substrate 30 for sealing the organic EL elements 3. The organic EL elements 3 have a substantially circular shape as viewed from a direction perpendicular to the element substrate 2. In this embodiment, description is made of the organic EL device 1 of a bottom emission type in which light emitted from the organic EL elements 3 is emitted from the element substrate side.

In the bottom emission-type organic EL device 1, since light from a luminescent layer 60 is emitted from the element substrate side, the element substrate 2 is transparent or translucent. For example, glass, quartz, and resin (plastic and plastic films) may be used, and a glass substrate is particularly preferably used.

The drive circuit portion 5 including driving TFTs 123 (drive elements 4) for the organic El elements 3 is formed on the element substrate 2. IC chips provided with drive circuits may be mounted on the element substrate 2 to form an organic EL device.

Specifically, the drive circuit portion 5 includes an underlying protective layer 281 formed on the surface of the element substrate 2 using an insulating material, and a silicon layer 241 formed thereon using a semiconductor material. Further, a gate insulating layer 282 mainly composed of $SiO_2$ and/or SiN is formed on the surface of the silicon layer 241, and gate electrodes 242 are formed on the surface of the gate insulating layer 282. The gate electrodes 242 each include a portion of scanning lines (not shown). In the silicon layer 241, a region facing each of the gate electrodes 242 with the gate insulating layer 282 provided therebetween serves as a channel region 241a. On the other hand, a first interlayer insulating layer 283 mainly composed of $SiO_2$ is formed on the surfaces of the gate electrodes 242 and the gate insulating layer 282.

In the silicon layer 241, a low-concentration source region 241b and a high-concentration source region 241S are provided on one of the sides of each channel region 241a, and a low-concentration drain region 241c and a high-concentration drain region 241D are provided on the other side of each channel region 241a, thereby forming a so-called LDD (Lightly Doped Drain) structure. Among these regions, the high-concentration source region 241S is connected to each source electrode 243 through a contact hole 243a passing through the gate insulating layer 282 and the first interlayer insulating layer 283. Each of the source electrodes 243 includes a portion of power lines (not shown). On the other hand, the high-concentration drain region 241D is connected to each drain electrode 244, which is disposed in the same layer as the source electrodes 243, through a contact hole 244a passing through the gate insulating layer 282 and the first interlayer insulating layer 283.

Further, a planarizing layer 284 mainly composed of a heat-resistant insulating resin material such as an acrylic or polyimide resin is formed on the source electrodes 243, the drain electrodes 244, and the first interlayer insulating layer 283. The planarizing layer 284 is formed for removing surface irregularity formed by the driving TFTs 123 (drive elements 4), the source electrodes 243, and the drain electrodes 244.

A plurality of pixel electrodes 23 is formed in an array on a region of the surface of the planarizing layer 284 in which the organic EL elements 3 are to be formed. Each of the pixel electrodes 23 is connected to the drain electrode 244 through a contact hole 23a provided in the planarizing layer 284. Namely, each of the pixel electrodes 23 is connected to the high-concentration drain region 241D of the silicon layer 241 through the drain electrode 244.

In addition, an inorganic partition 25 composed of an inorganic insulating material such as $SiO_2$ is formed to surround the pixel electrodes 23 on the surface of the planarizing film 284. A plurality of functional films is laminated on the surface of each of the pixel electrodes 23 exposed from apertures of the inorganic partitions 25 to form each organic EL element 3. In accordance with this embodiment, each of the organic EL elements 3 includes a laminate of the pixel electrode 23 functioning as an anode, the hole injection layer 70 for injecting holes from the pixel electrode 23, an electronic block layer (intermediate layer) 65, the luminescent layer 60 composed of an organic EL substance, and a common electrode functioning as a cathode 50.

In the bottom emission-type organic EL device 1, the pixel electrodes 23 functioning as the anodes are made of a transparent conductive material. As the transparent conductive material, ITO (indium tin oxide) and IZO (trade name, indium zinc oxide) may be used. ITO is composed of a material containing indium oxide ($In_2O_3$) doped with tin (Sn).

As a material for forming the hole injection layer 70, a dispersion liquid of 3,4-polyethylenedioxythiophene/polystyrene sulfonic acid (PEDOT/PSS) is preferably used. The PEDOT/PSS is prepared by dispersing 3,4-polyethylenedioxythiophene, which is a polythiophene derivative, in polystyrene sulfonic acid used as a dispersion medium, and further dispersing the resultant dispersion in water.

The material for forming the hole injection layer 70 is not limited to the above, and various materials may be used. For example, a material prepared by dispersing polystyrene, polypyrrole, polyaniline, polyacetylene, or a derivative thereof in an appropriate dispersion medium, e.g., the above-described polystyrene sulfonic acid, may be used.

The hole injection layer 70 contains indium element. The indium element contained in the hole injection layer 70 includes indium element which constitutes the pixel electrodes 23 (ITO) provided below the hole injection layer 70 and which diffuses in the hole injection layer 70, and indium element contained in the hole injection layer 70 during the formation thereof.

Chemical Formula 1

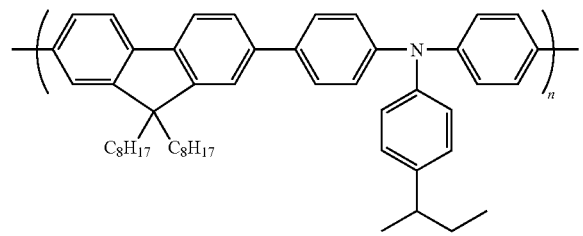

The electronic block layer 65 is provided on the hole injection layer 70. The electronic block layer 65 has the function to prevent the electrons supplied from the cathode from passing through the luminescent layer 60, promote recombination of electrons and holes in the luminescent layer 60, and improve luminous efficiency. For the electron block layer 65, a material having the relatively high function to suppress electron migration is preferably used.

On the other hand, as a material for forming the luminescent layer 60, a known luminescent material capable of fluorescence or phosphorescence emission is used. Preferred examples of such a material include (poly)fluorene derivatives (PF), (poly)para-phenylenevinylene derivatives (PPV), polyphenylene derivatives (PP), polypara-phenylene derivatives (PPP), polyvinylcarbazole (PVK), polythiophene derivatives, and polysilane such as polymethylphenylsilane (PMPS). These polymer materials may be doped with a polymer material such as a perylene dye, a coumarin dye, or a rnodamine dye, or a low-molecular material such as rubrene, perylene, 9,10-diphenylanthracene, tetraphenylbutadiene, Nile red, coumarin 6, or quinacridone.

In this embodiment, the luminescent layer having an emission wavelength band corresponding red is used. However, a luminescent layer having an emission wavelength band corresponding green or blue may be used. For example, MEH-PPV (poly(3-methoxy-6-(3-ethylhexyl)para-phenylenevinylene) may be used as a material for forming the red light-emitting organic EL layer 60, a mixed solution of polydioctylfluorene and F8BT (alternating copolymer of dioctylfluorene and benzothiadizole) may be used as a material for forming the green light-emitting organic EL layer 60, and polydioctylfluorene may be used as a material for forming the blue light-emitting organic EL layer 60. In particular, the thickness of the organic EL layer 60 is not limited, and the thickness is controlled to a desired value for each color.

The cathode 50 preferably has a laminated structure of a main cathode and an auxiliary cathode. For the main cathode, a material having a work function of 3.0 eV or less, such as Ca, Mg, or LiF, is preferably used. As a result, the function as an electron injection layer is imparted to the main cathode, and thus emission from the luminescent layer is performed at a low voltage. The auxiliary cathode has the function to increase the conductivity of the whole cathode 50 and protect the main cathode from oxygen and moisture. Therefore, for the auxiliary cathode, a metal material having excellent conductivity, such as Al, Au, or Ag, is preferably used.

Further, the sealing substrate 30 is bonded to the top of the cathode 50 through an adhesive layer 40.

A sealing cap may be fixed to the periphery of the element substrate 2 so as to cover the whole of the cathode 50, and a getter agent may be disposed in the sealing cap, for absorbing moisture and oxygen. Alternatively, an inorganic sealing film composed of $SiO_2$ may be laminated on the surface of the cathode 50.

In the above-described organic EL device 1, image signals supplied from the source electrodes 243 of the drive circuit portion 5 are applied to the pixel electrodes 23 with predetermined timing by the drive elements 4. The holes injected from the pixel electrodes 23 and the electrons injected from the cathode 50 recombine in the luminescent layer 60 to emit light at a predetermined wavelength. The emitted light passes through the pixel electrodes 23, the drive circuit portion 5, and the element substrate 2, which are made of transparent materials, and is emitted to the outside. Since the inorganic partition 25 is composed of an insulating material, a current flows through only the apertures of the inorganic partition 25 so that the luminescent layer 60 emits light. Therefore, the insides of the apertures of the inorganic partition 25 serve as pixel regions of the organic EL elements 3.

(Method for Manufacturing Organic EL Device)

Next, a method for manufacturing the organic EL device according to this embodiment will be described.

FIGS. 5 to 9 are drawings showing the respective steps of the method for manufacturing the organic EL device according to the first embodiment. In each of FIGS. 5 to 9, the element substrate, the drive circuit portion, and the sealing substrate are omitted for the sake of easy understanding.

Figure 5:
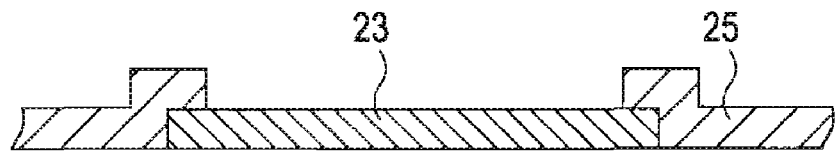
FIG. 5 is a drawing showing a step of a method for manufacturing the organic EL device shown in FIG. 4.

First, as shown in FIG. 5, the inorganic partition 25 is formed around the pixel electrodes 23. Next, the surface of the substrate is ultrasonically cleaned with extrapure water. Further, atmospheric plasma processing with oxygen gas is performed as a lyophilic treatment of the surface of the pixel electrodes 23.

Figure 6:
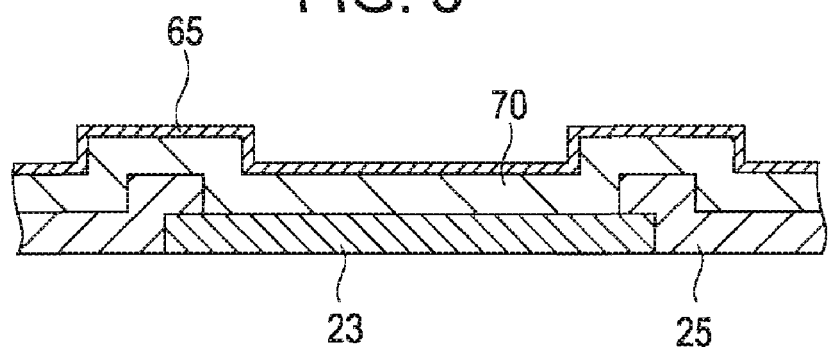
FIG. 6 is a drawing showing a step of the method for manufacturing the organic EL device shown in FIG. 4.

Next, as shown in FIG. 6, the hole injection layer 70 is formed over the entire surfaces of the pixel electrodes 23 and the inorganic partition 25 by the liquid-phase process. Specifically, first, a liquid composition prepared by dissolving or dispersing a material for forming the hole injection layer 70 in a solvent is applied to the whole of the substrate by spin coating, spray coating, or dipping. Indium (III) sulfate n-hydrate is previously added to the liquid composition. The amount of the indium (III) sulfate n-hydrate added is about 0.3% relative to the total weight of the liquid composition. The resultant coated film is dried by heating at about 200° C. for about 10 minutes in air to remove the moisture contained in the film.

Next, the electronic block layer 65 is also formed by the liquid-phase process. Specifically, a liquid of TFB constituting the electronic block layer 65 is applied over the entire surface of the substrate by spin coating, spray coating, or dipping. Then, the electronic block layer 65 is dried in a $N_2$ glove box. Specifically, the substrate is placed in a chamber of the $N_2$ glove box, and the inside of the chamber is replaced with $N_2$ gas to decrease the moisture and oxygen concentrations in the chamber to 1 ppm or less. Next, the coated film is dried by heating the substrate at 180° C. for 60 minutes to form the electronic block layer 65. Then, a soluble layer of the electronic block layer 65 is preferably removed with a xylene solvent, and thereby the electronic block layer 65 insoluble in a xylene solvent is formed.

Figure 7:
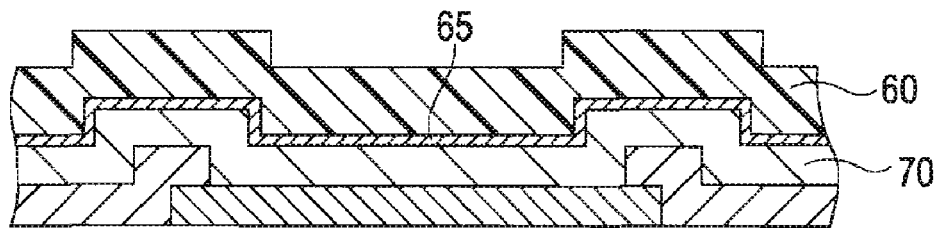
FIG. 7 is a drawing showing a step of the method for manufacturing the organic EL device shown in FIG. 4.

Next, as shown in FIG. 7, the luminescent layer 60 is formed on the surface of the electronic block layer 65 by the liquid-phase process. Specifically, a liquid of a material for forming the luminescent layer 60 is applied over the entire surface of the substrate by spin coating, spray coating, or dipping.

Figure 8:
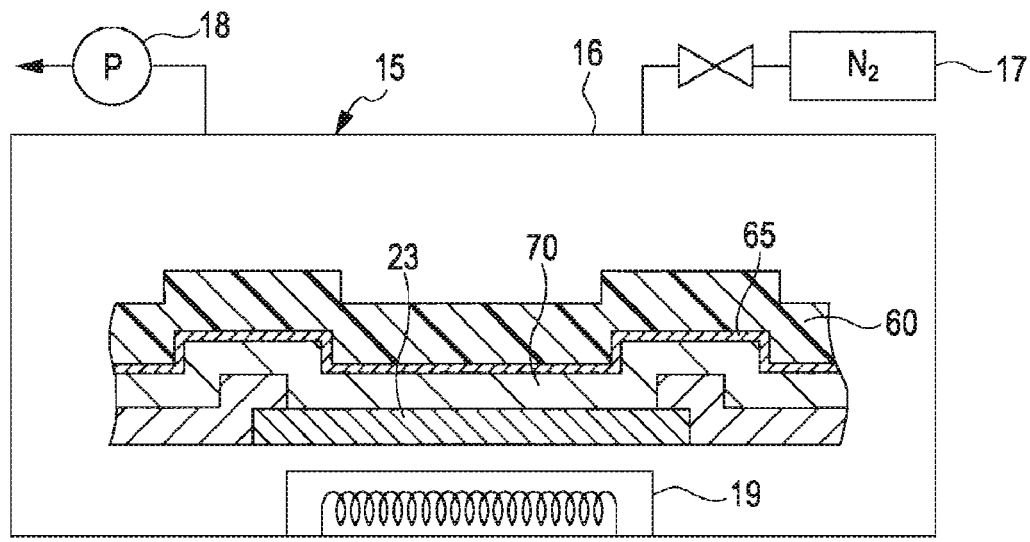
FIG. 8 is a drawing showing a step of the method for manufacturing the organic EL device shown in FIG. 4.

Then, as shown in FIG. 8, the luminescent layer 60 is dried. The drying process is performed in a $N_2$ glove box 15. The $N_2$ glove box 15 includes a chamber 16 in which the substrate is placed, a $N_2$ gas supply device 17 for supplying $N_2$ gas into the chamber 16, an exhaust device 18 for exhausting the chamber 16, and a heating device 19 for the substrate. The air in the chamber 16 is replaced by $N_2$ gas using the $N_2$ gas supply device 17.

Figure 9:
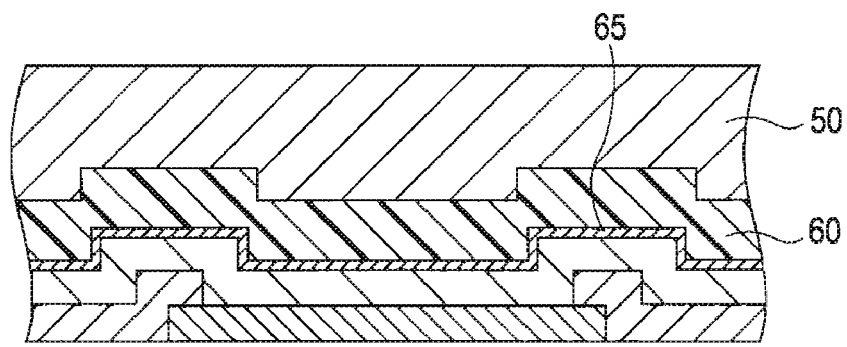
FIG. 9 is a drawing showing a step of the method for manufacturing the organic EL device shown in FIG. 4.

Then, the substrate on which the forming material of the luminescent layer has been coated is placed in the chamber 16 of the $N_2$ glove box 15. Next, the inside of the chamber 16 is replaced with $N_2$ gas to decrease the moisture and oxygen concentrations in the chamber 16 to 1 ppm or less. Next, the coated film is dried by, for example, heating the substrate at about 180° C. for about 20 minutes using the heating device 19, thereby forming the luminescent layer 60. Then, as shown in FIG. 9, the cathode 50 is formed by vacuum evaporation. In order to suppress deterioration due to oxygen and moisture, the cathode 50 is sealed with a thermosetting resin to form the organic EL device 1 according to the first embodiment.

The inventors have found that when the hole injection layer 70 is formed on the pixel electrodes 23 composed of ITO (Indium Tin Oxide), indium element contained in the pixel electrodes 23 diffuses into the hole injection layer 70. It has been also found that when the hole injection layer 70 contains indium element, the drive voltage of the hole injection layer 70 is decreased to increase the emission lifetime of the organic EL device 1. It has been further found that the metal element is not limited to indium element, and the same effect is obtained by other metal elements.

Therefore, in this embodiment of the invention, the hole injection layer 70 is formed on the pixel electrodes 23 using the hole injection layer forming material containing an organic material with a hole injection ability and indium (III) sulfate n-hydrate. Thus, the hole injection layer 70 containing indium element is formed. As a result, the drive voltage of the hole injection layer 70 is decreased, and the lifetime of the organic EL device 1 is increased.

Second Embodiment

Next, a second embodiment of the invention will be described. Like in the first embodiment, in each of the drawings, the reduced scale of each member is appropriately changed for making the size of each member recognizable. The description of the same components as in the first embodiment is omitted. Since this embodiment is different from the first embodiment in the constitution of a hole injection layer of an organic EL device and the process for forming the hole injection layer in the process for manufacturing the organic EL device, this point is mainly described below.

An organic EL device 201 according to this embodiment includes a hole injection layer 270 containing magnesium element. The process for manufacturing the organic EL device 201 containing magnesium element is described below.

Like in the first embodiment, an inorganic partition 225 is formed around pixel electrodes 223, and the surface of the substrate is ultrasonically cleaned with extra pure water. Further, atmospheric plasma processing with oxygen gas is performed as a lyophilic treatment of the surface of the pixel electrodes 223.

Figure 10:
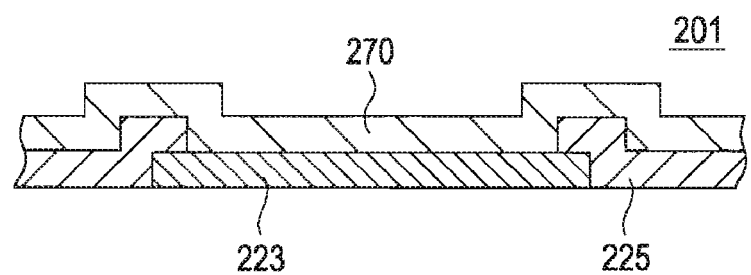
FIG. 10 is a drawing showing a step of a method for manufacturing an organic EL device according to a second embodiment of the invention.

Next, as shown in FIG. 10, the hole injection layer 270 is formed over the entire surfaces of the pixel electrodes 223 and the inorganic partition 225 by the liquid-phase process. Specifically, first, a liquid composition prepared by dissolving or dispersing a material for forming the hole injection layer 270 in a solvent is applied to the whole of the substrate by spin coating, spray coating, or dipping. Magnesium sulfate heptahydrate is previously added to the liquid composition. The amount of the magnesium sulfate heptahydrate added is about 0.3% relative to the total weight of the liquid composition. The resultant coated film is dried by heating at about 200° C. for about 10 minutes in air to remove the moisture contained in the film. After the hole injection layer 270 is formed as described above, an electronic block layer, a luminescent layer, and a cathode are formed by the same processes as in the first embodiment.

In accordance with this embodiment of the invention, the hole injection layer 270 contains magnesium element. Therefore, like in the case of the hole injection layer containing indium element, the drive voltage of the hole injection layer 270 is decreased, and the lifetime of the organic EL device 201 is increased. Further, the magnesium sulfate heptahydrate used for forming the hole injection layer 270 is advantageous in that it has high safety for human bodies and environments.

Third Embodiment

Next, a third embodiment of the invention will be described. In this embodiment, an organic EL device used in a display device displaying still images and animation is described as an example.

Figure 11:
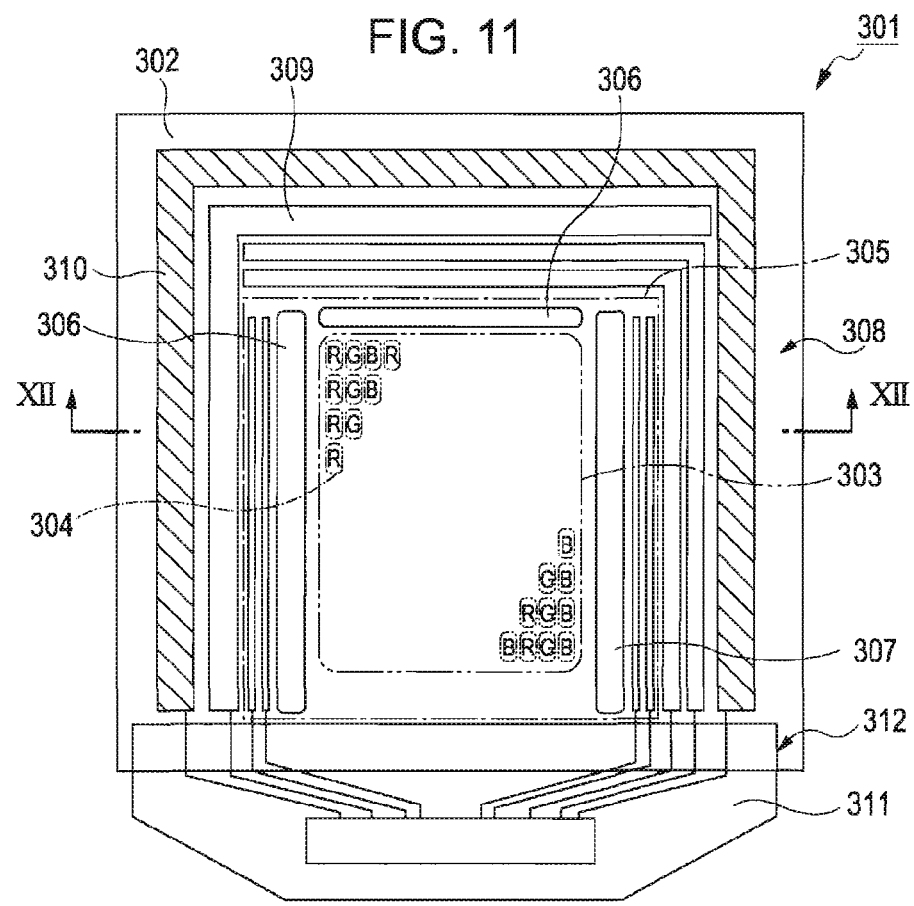
FIG. 11 is a plan view showing the constitution of an organic EL device according to a third embodiment of the invention.

FIG. 11 is a plan view schematically showing the constitution of an organic EL device 301.

As shown in FIG. 11, the organic EL device 301 is provided with a display region 303 disposed at the central portion of the top of an element substrate 302, for display images and animation. In the display region (surrounded by a two-dot chain line in FIG. 11) 303, pixel regions 304 are arrayed in a matrix. Each of the pixel regions 304 is a region emitting light of any one of red (R), green (G), and blue (B). In FIG. 11, the pixel regions emitting red, green, and blue lights are arrayed in that order from the left side of the drawing.

In a region (held between a one-dot chain line and a two-dot chain line in FIG. 11) 305 around the display region 303, a drive circuit 306 for driving emission of the pixel regions 304 and an inspection circuit 307 are formed. In a region around the region 305, i.e., a peripheral region 308 of the element substrate 302, a driver 309 for supplying signals to the drive circuit 306 and the inspection circuit 307 and a power supply circuit 310 for supplying power to the portions are formed. In addition, a connecting portion 312 to be connected to an external circuit board 311 is provided on the lower side of the element substrate 302 shown in FIG. 11.

Figure 12:
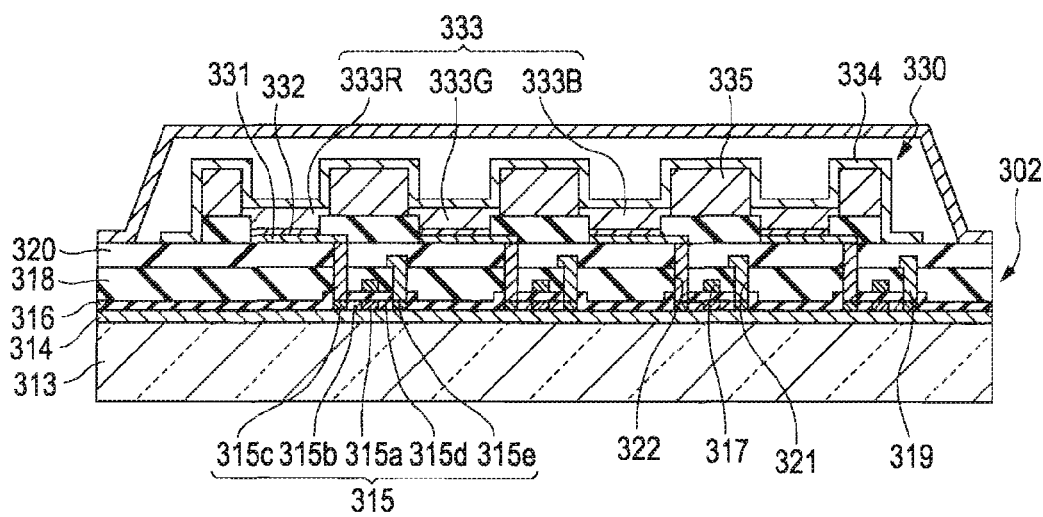
FIG. 12 is a sectional view showing the constitution of the organic EL device shown in FIG. 11.

FIG. 12 is a sectional view of the constitution taken along line A-A in FIG. 11.

The element substrate 302 includes a substrate 313, a surface layer 314, a semiconductor layer 315, a gate insulating layer 316, gate electrodes 317, a first insulating layer 318, source electrodes 319, and a second insulating layer 320.

The substrate 313 is a rectangular substrate composed of, for example, glass, quartz, or silicon. The surface layer 314 is formed on the surface of the substrate 313 and composed of, for example, silicon oxide or silicon nitride.

The semiconductor layer 315 is provided as switching elements of the organic EL device 301 using, for example, a thin film of amorphous silicon. Like in the first embodiment, the semiconductor layer 315 includes a channel region 315a, a low-concentration source region 315b, a high-concentration source region 315c, a low-concentration drain region 315d, and a high-concentration drain region 315e.

The gate insulating layer 316 is provided to cover the surface layer 314 and the semiconductor layer 315. The gate electrodes 317 are provided on the gate insulating layer 316 and disposed to overlap the respective channel regions 315a of the semiconductor layer 315 in a plan view. The semiconductor layer 315, the gate insulating layer 316, and the gate electrodes 317 constitute thin film transistors. The first insulating layer 318 is composed of, for example, silicon oxide or silicon nitride, and provided to cover the gate insulating layer 316 and the gate electrodes 317.

The source electrodes 319 are provided on the first insulating layer 318 and connected to the respective high-concentration source regions 315c of the semiconductor layer 315 through contact holes 321 formed to pass through the first insulating layer 318 and the gate insulating layer 316. The second insulating layer 320 is composed of, for example, silicon oxide or silicon nitride, and provided to cover the first insulating layer 318 and the source electrodes 319.

An organic EL layer 330 mainly includes an anode 331, a hole injection layer 332, a luminescent layer 333, and a cathode 334, and a partition 335. The partition 335 is provided directly above the second insulating layer 320 of the element substrate 302. The anode 331, the hole injection layer 332, and the luminescent layer 333 are laminated in each of the regions surrounded by the partition 335, and the cathode 334 is provided to cover the luminescent layer 333 and the partition 335.

The anode 331 is provided in the form of a thin film immediately above the second insulating layer 320 of the element substrate 302 and is an electrode composed of a light transmitting metal, e.g., ITO or IZO (trade name). The anode 331 is connected to each of the high-concentration drain regions 315e of the semiconductor layer 315 through a contact hole passing through the three insulating layers, i.e., the second insulating layer 320, the first insulating layer 318 and the gate insulating layer 316.

The hole injection layer 332 injects holes from the anode 331 to the luminescent layer 333. The luminescent layer 333 emits light due to combination of holes from the hole injection layer 332 and electrons from the cathode 334. The luminescent layer 333 includes a red light-emitting luminescent layer 333R, a green light-emitting luminescent layer 333G, and a blue light-emitting luminescent layer 333B.

The hole injection layer 332 and the luminescent layer 333 are formed using organic materials. The hole injection layer 332 contains a metal element such as indium element or magnesium element at a predetermined concentration. For example, the red light-emitting luminescent layer 333R, the green light-emitting luminescent layer 333G, and the blue light-emitting luminescent layer 333B may contain different types of metal elements or may have different concentrations of metal element.

The cathode 334 is composed of, for example, a transparent conductive material, such as ITO, and serves as an electrode for injecting electrons into the luminescent layer 333.

Next, the process for manufacturing the organic EL device 301 according to this embodiment will be described.

Like in the first embodiment, the partition 335 is formed around the pixel electrodes 331, and the surface of the substrate is ultrasonically cleaned with extra pure water. Further, atmospheric plasma processing with oxygen gas is performed as a lyophilic treatment of the surface of the pixel electrodes 331.

Next, the hole injection layer 332 is formed on each of the pixel electrodes 331. Specifically, a liquid composition is previously prepared by dissolving or dispersing a material for forming the hole injection layer 332 in a solvent and is applied to the regions surrounded by the partition 335 by an ink jet method to form coated films. A metal element is previously added to the liquid composition. The resultant coated films are dried by heating at about 200° C. for about 10 minutes in air to remove the moisture contained in the films. After the hole injection layer 332 is formed as described above, an electronic block layer, a luminescent layer, and a cathode are formed by the same processes as in the first embodiment.

In accordance with this embodiment of the invention, the red light-emitting luminescent layer 333R, the green light-emitting luminescent layer 333G, and the blue light-emitting luminescent layer 333B contain different types of metal elements or have different concentrations of metal element. Therefore, it may be possible to add an optimum type of metal element or an optimum concentration of metal element according to the types of the organic materials used for forming the luminescent layers, thereby more effectively increasing the lifetime of the organic EL device 301.

EXAMPLES

An example of the invention will be described with reference to FIGS. 13 to 16. This example relates to the amounts of indium (III) sulfate n-hydrate (first embodiment) and magnesium sulfate heptahydrate (second embodiment) added for forming the hole injection layers.

Figure 13:
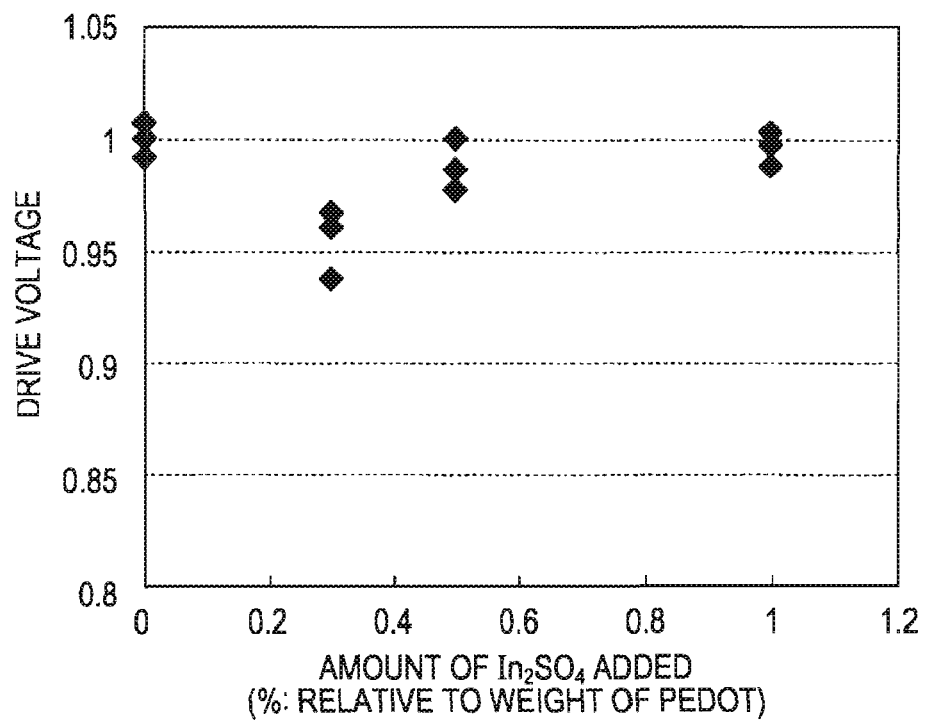
FIG. 13 is a graph showing the drive voltage of an organic EL device measured in an example of the third embodiment.
Figure 14:
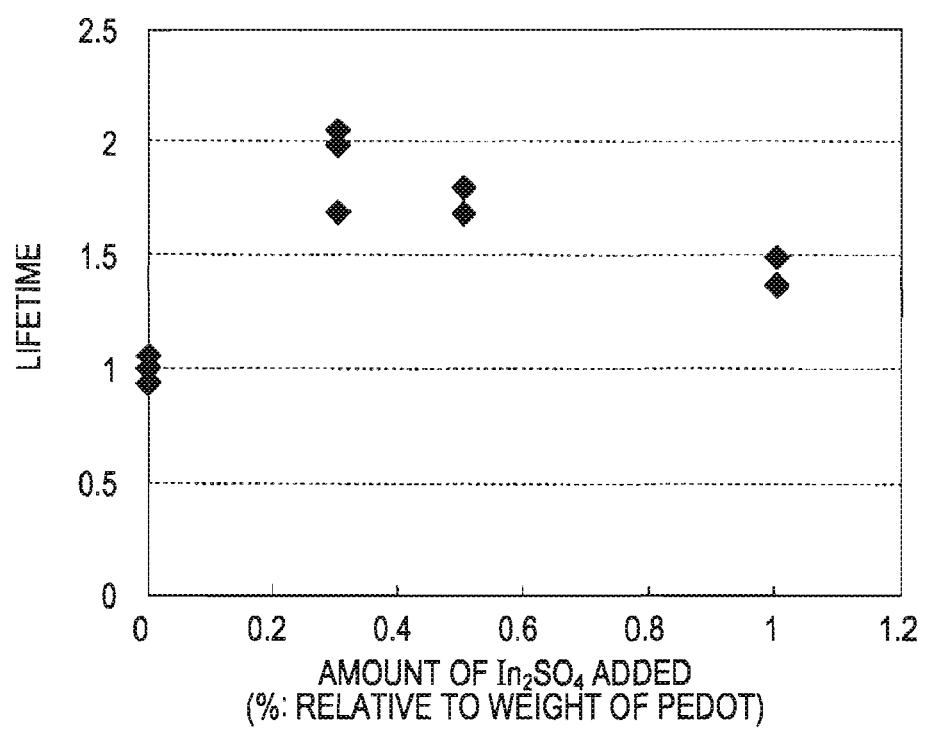
FIG. 14 is a graph showing the lifetime of an organic EL device measured in an example of the third embodiment.

In the first embodiment, the amount of indium (III) sulfate n-hydrate added is 0.3% relative to the total weight of the liquid composition. In this example, the adding amount was changed to 0% (not containing), 0.3%, 0.5%, and 1.0%, and the drive voltage (FIG. 13) and lifetime (FIG. 14) of the organic EL device 1 were measured. The term "lifetime" represents the time required from the start of flow of a current at a current density of 600 mA/cm$^2$ to a 10% decrease in luminance. FIGS. 13 and 14 show relative values to 1 at an amount of indium (III) sulfate n-hydrate added of 0%.

FIG. 13 indicates that when the amount of indium (III) sulfate n-hydrate added is 0.3%, the drive voltage is about 0.95. At this time, the lifetime of the organic EL device 1 is about 2.0 and is thus about two times as shown in FIG. 14.

FIG. 13 indicates that when the amount of indium (III) sulfate n-hydrate added is 0.5%, the drive voltage is about 0.98. At this time, the lifetime of the organic EL device 1 is about 1.7 and is thus about 1.7 times as shown in FIG. 14.

FIG. 13 indicates that when the amount of indium (III) sulfate n-hydrate added is 1.0%, the drive voltage is about 0.99. At this time, the lifetime of the organic EL device 1 is about 1.5 and is thus about 1.5 times as shown in FIG. 14.

It is read from these results that when the amount of indium (III) sulfate n-hydrate added is 0.3%, the drive voltage is most decreased, and the lifetime is most increased.

Figure 15:
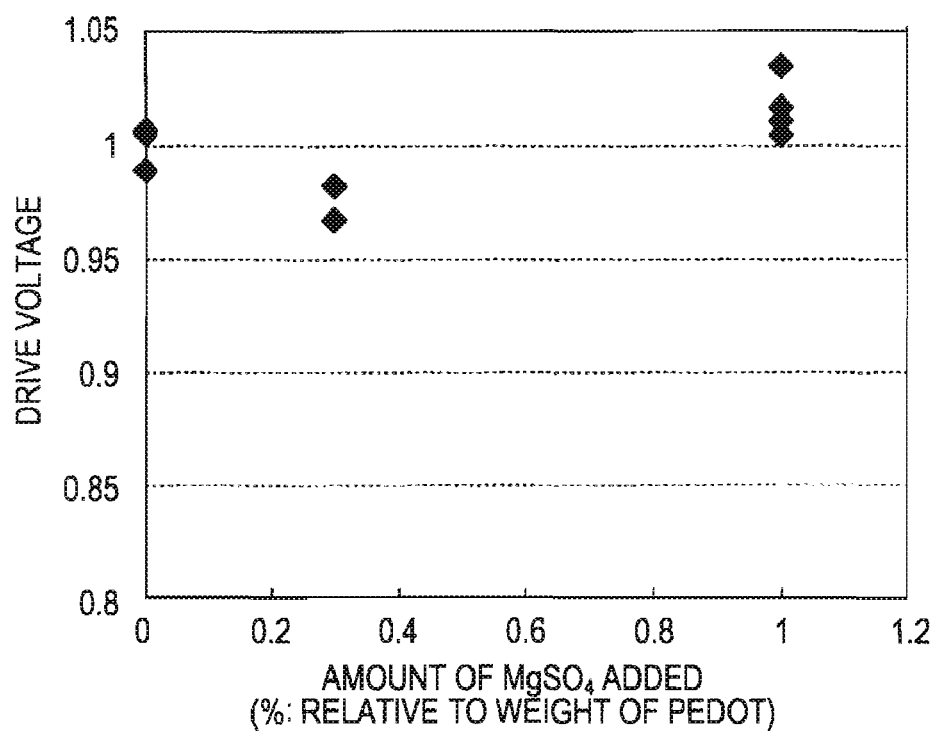
FIG. 15 is a graph showing the drive voltage of an organic EL device measured in an example of the third embodiment.
Figure 16:
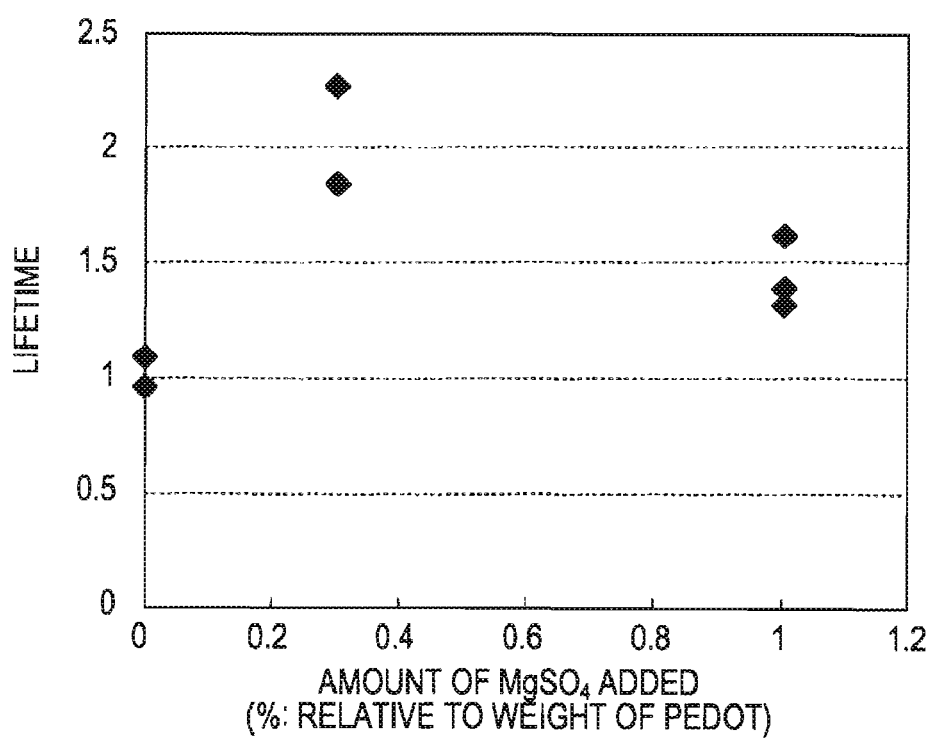
FIG. 16 is a graph showing the lifetime of an organic EL device measured in an example of the third embodiment.

In the second embodiment, the amount of magnesium sulfate neptahydrate added is 0.3% relative to the total weight of the liquid composition. In this example, the adding amount was changed to 0% (not containing), 0.3%, and 1.0%, and the drive voltage (FIG. 15) and lifetime (FIG. 16) of the organic EL device 201 were measured. As described above, the term "lifetime" represents the time required from the start of flow of a current at a current density of 600 mA/cm$^2$ to a 10% decrease in luminance. FIGS. 15 and 16 show relative values to 1 at an amount of magnesium sulfate heptahydrate added of 0%.

FIG. 15 indicates that when the amount of magnesium sulfate heptahydrate added is 0.3%, the drive voltage is about 0.97. At this time, the lifetime of the organic EL device 201 is about 2.0 and is thus about two times as shown in FIG. 16.

FIG. 15 indicates that when the amount of magnesium sulfate heptahydrate added is 1.0%, the drive voltage is about 1.02. At this time, the lifetime of the organic EL device 201 is about 1.5 and is thus about 1.5 times as shown in FIG. 16.

It is read from these results that when the amount of magnesium sulfate heptahydrate added is 0.3%, the drive voltage is most decreased, and the lifetime is most increased.

What is claimed is:

1. A method for manufacturing an organic EL device including an organic EL element provided on a substrate and having a plurality of organic layers including at least a hole injection layer and a luminescent layer, and a cathode and an anode holding the organic layers therebetween, the method comprising:
    forming the anode on the substrate;
    forming the hole injection layer on the anode using a hole injection layer forming material containing thiophene derivatives and an Indium (III) sulfate n-hydrate or a Magnesium sulfate heptahydrate;
    forming the luminescent layer on the hole injection layer; and
    forming the cathode on the luminescent layer.

2. The method for manufacturing the organic EL device according to claim 1, further comprising:
    forming an intermediate layer on the hole injection layer between the formation of the hole injection layer and the formation of the luminescent layer;
    wherein the organic EL element further includes the intermediate layer disposed between the hole injection layer and the luminescent layer.

3. The method for manufacturing the organic EL device according to claim 1, wherein the luminescent layer is composed of a luminescent material emitting red light.

4. The method for manufacturing the organic EL device according to claim 1, wherein a plurality of the organic EL elements is provided and arranged in a matrix, the luminescent layers constituting the plurality of the organic EL elements include a first luminescent layer emitting light at a first wavelength and a second luminescent layer emitting light at a second wavelength different from the first wavelength, and the hole injection layer of the organic EL device including the first luminescent layer and the hole injection layer of the organic EL element including the second luminescent layer contain different types of metal elements.

5. The method for manufacturing the organic EL device according to claim 4, wherein the formation of the hole injection layer includes forming a coated film of a liquid composition by an ink jet method, the liquid composition being prepared by dissolving or dispersing the hole injection layer forming material in a solvent.

6. The method for manufacturing the organic EL device according to claim 1, wherein a plurality of the organic EL elements is provided and arranged in a matrix, the luminescent layers constituting the plurality of the organic EL elements include a first luminescent layer emitting light at a first wavelength and a second luminescent layer emitting light at a second wavelength different from the first wavelength, and the hole injection layer of the organic EL device including the first luminescent layer and the hole injection layer of the organic EL element including the second luminescent layer contain metal elements at different concentrations.

7. The method for manufacturing the organic EL device according to claim 1, wherein the formation of the hole injection layer includes forming a coated film of a liquid composition on the anode, the liquid composition being prepared by dissolving or dispersing the hole injection layer forming material in a solvent.

8. An electronic apparatus comprising an organic EL device manufactured by the method for manufacturing the organic EL device according to claim 1.

9. The method for manufacturing the organic EL device according to claim 1, wherein the hole injection layer forming material includes a polystyrene sulfonic acid and a 3,4-polyethylenedioxythiophene as the thiophene derivatives.

10. The method for manufacturing the organic EL device according to claim 1, further comprising the step of forming an intermediate layer between the hole injection layer and the luminescent layer, the intermediate layer being formed of a material that suppresses electron migration.

11. The method for manufacturing the organic EL device according to claim 1, further comprising the step of forming an intermediate layer between the hole injection layer and the luminescent layer, the intermediate layer being formed of a material that (1) prevents electrons supplied from the cathode from passing through the luminescent layer and (2) promotes recombination of the electrons and holes in the luminescent layer.

* * * * *